US009296879B2

(12) United States Patent
Yamada et al.

(10) Patent No.: US 9,296,879 B2
(45) Date of Patent: Mar. 29, 2016

(54) HARDMASK

(71) Applicant: Rohm and Haas Electronic Materials LLC, Marlborough, MA (US)

(72) Inventors: Shintaro Yamada, Shrewsbury, MA (US); Deyan Wang, Hudson, MA (US); Sabrina Wong, Worcester, MA (US); Cong Liu, Shrewsbury, MA (US); Cheng-Bai Xu, Southborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 129 days.

(21) Appl. No.: 14/017,281

(22) Filed: Sep. 3, 2013

(65) Prior Publication Data
US 2015/0064612 A1 Mar. 5, 2015

(51) Int. Cl.
*C08K 5/56* (2006.01)
*C08K 5/00* (2006.01)
*G03F 7/09* (2006.01)
*H01L 21/027* (2006.01)
*H01L 21/033* (2006.01)
*C08G 79/00* (2006.01)
*C09B 57/10* (2006.01)
*C09B 69/10* (2006.01)

(52) U.S. Cl.
CPC . *C08K 5/56* (2013.01); *C08G 79/00* (2013.01); *C08K 5/0091* (2013.01); *C09B 57/10* (2013.01); *C09B 69/10* (2013.01); *G03F 7/09* (2013.01); *G03F 7/091* (2013.01); *H01L 21/027* (2013.01); *H01L 21/0332* (2013.01)

(58) Field of Classification Search
None
See application file for complete search history.

(56) References Cited

U.S. PATENT DOCUMENTS

| | | | |
|---|---|---|---|
| 6,740,469 B2 | 5/2004 | Krishnamurthy et al. | |
| 7,067,346 B2 | 6/2006 | Hill et al. | |
| 8,795,774 B2 | 8/2014 | Wang et al. | |
| 8,927,439 B1 | 1/2015 | Wang et al. | |
| 2004/0048194 A1 | 3/2004 | Breyta et al. | |
| 2004/0058275 A1* | 3/2004 | Neef | C08G 79/00 430/271.1 |
| 2011/0213190 A1 | 9/2011 | Cazaux et al. | |
| 2013/0011630 A1 | 1/2013 | Sullivan et al. | |
| 2013/0337179 A1 | 12/2013 | Wang et al. | |
| 2014/0202632 A1 | 7/2014 | Wang et al. | |
| 2014/0206201 A1 | 7/2014 | Wang et al. | |
| 2015/0024522 A1 | 1/2015 | Wang et al. | |

FOREIGN PATENT DOCUMENTS

WO 2013012068 A1 1/2013

OTHER PUBLICATIONS

Okada et al (Chemical Abstract—Accession No. 2004:129250, which is English abstract for "Synthesis and Electron Transfer Behavior of Novel Alternative titanium-Organic Moieties Hybrid Copolymers", Electrochmistry (2004), 72(2), p. 84-91).*
Nogaideli et al (Chemical Abstract—Accession No. 1978:424870, which is English abstract for "Synthesis of Polymers Based on Chelate Titanium Compounds", Izvestiya Akademii Nauk Gruzinskoi SSR, Seriya Khimicheskaya (1977), 3(4), p. 344-349.*
Sugita et al (Chemical Abstract—Accession No. 2005:1226823, which is English abstract for "Electrical and Optical Properties of Organic-Titanium Hybrid Polymer, Poly(2,3-dicyanophenyl bis-2,4-pentanedionate titanium alkoxide", Chemical Physics Letters (2005), 416(1-3), p. 79-82).*
Sugita et al ("Electrical and Optical Properties of Organic-Titanium Hybrid Polymer, Poly(2,3-dicyanophenyl bis-2,4-pentanedionate titanium alkoxide", Chemical Physics Letters (2005), 416(1-3), p. 79-82).*
Search report for corresponding Taiwan Application No. 103130352 dated Sep. 2, 2015.

* cited by examiner

Primary Examiner — Sin Lee
(74) Attorney, Agent, or Firm — S. Matthew Cairns

(57) ABSTRACT

This invention provides a composition containing an organometallic compound having a chromophore moiety in the metal polymer backbone which allows a wider range of n/k values such that substrate reflectivity can be controlled under various conditions.

16 Claims, No Drawings

HARDMASK

The present invention relates generally to the field of semiconductor manufacture, and more particularly to the field of hardmasks used in the manufacture of semiconductors.

With the continuous decrease in both critical dimension and pitch in 193 nm immersion lithography, the use of a hardmask in certain layers of integrated circuit fabrication has become increasingly popular, owing to the excellent etch selectivity of the hardmask materials. Certain metal hardmasks, such as TiN, are applied by chemical vapor deposition (CVD), onto a processed wafer. Amorphous carbon hardmask, applied through either CVD or a spin-on technique, and silicon hardmask (or silicon antireflective coating or SiARC) are among the conventional technologies in integrated circuit fabrication. Spin-on, metal hardmask is now gaining attraction in the integrated circuit industry, in part due to potential cost reductions as compared to conventional approaches, as well as for simplification of fabrication processes.

Oxymetal hardmasks are generally characterized as films containing a majority of inorganic domains with $(-M-O-)_n$ linkages (oxymetal domains), where M is a metal and n>1, and may also be composed of minor amounts of other elements, such as carbon. Other hardmasks, such as mixed domain hardmasks, contain both oxymetal domains and metal nitride domains. Such conventional hardmasks may contain one or more metals, such as Hf, Zr, Ti, W, Al, Ta and Mo. The etch resistance of oxymetal domain-containing hardmask films is dependent, in part, on the particular metal used as well as the level of $(-M-O-)_n$ domains present, with an increased level of such domains providing greater etch resistance.

One of the applications that a spin-on metal hardmask can be used for is an antireflective layer in the photolithography process, which requires certain values of n (refractive index) and k (absorbance) depending on optical properties of substrates and illumination conditions. Many proposed spin-on metal hardmask platforms are based on chemistry which relies on intrinsic n and k values of the resulting metal oxides. The n/k of such metal oxides can be varied within certain parameters by applying different cure temperatures, such as is disclosed in U.S. Pat. App. Pub. 2004/0048194. However, the range of n and k with this method is limited and unable to provide low reflectivity when certain metals are required for other reasons, such as for their etch selectivity.

Attempts have been made to prepare antireflective films having $(-M-O-)_n$ domains. For example, U.S. Pat. No. 6,740,469 discloses organometallic polymers having recurring units of the formula

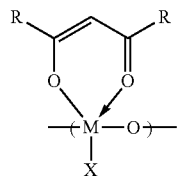

where X is selected from light attenuating moieties and polyols, M is a metal, and each R is individually selected from hydrogen, alkyls, aryls, alkoxys and phenoxys. However, this patent does not specifically describe suitable light attenuating moieties. These materials are designed to be wet developable in conjunction with a thin photoresist layer used in the manufacture of integrated circuits. However, because of the fixed metal-light attenuating moiety stoichiometry, these materials do not allow for the ability to tailor n and k values as may be needed for various applications, and because of the wet developability of these materials, they may not be compatible with other materials used in various integrated circuit manufacturing processes.

There remains a need for new metal hardmask compositions that can be used to form a metal hardmask film having excellent solvent resistance while also reducing reflection of radiation used in lithographic processes. These needs and others have been met by the following invention.

The present invention provides a composition comprising: an organometallic compound of the formula

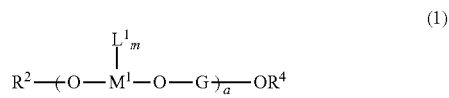

wherein $R^2=(C_1-C_{20})$hydrocarbyl; $M^1$ is a Group 3 to Group 14 metal; $G=R^3{}_b$-$Ch$-$R^3{}_b$ or $Ch(OM^1L^1{}_mOR^2)_c$; $Ch$=a chromophore moiety; $R^3$ is a divalent linking group having from 1 to 12 carbon atoms; $R^4$=H, $R^2$ or $M(L^1)_mOR^2$; $L^1$ is a ligand; m refers to the number of ligands and is an integer from 1-4; a=an integer from 1 to 20; each b is independently an integer from 0 to 25; c=1 or 2; and an organic solvent. Such composition is suitable for forming an antireflective oxymetal layer, which may also function as a hardmask.

Also provided by the present invention is a method of forming an antireflective oxymetal layer comprising: providing a substrate; coating a film of the composition described above on a surface of the substrate; and curing the film under conditions sufficient to form an oxy-metal layer comprising the chromophore moiety.

As used throughout this specification, the following abbreviations shall have the following meanings, unless the context clearly indicates otherwise: ca.=approximately; °C.=degrees Celsius; g=grams; mg=milligrams; mmol=millimoles; L=liters; mL=milliliters; μL=microliters; nm=nanometers; Å=angstroms; Et=ethyl; i-Pr=iso-propyl; n-Bu=n-butyl; t-Bu=tert-butyl; and rpm=revolutions per minute. All amounts are percent by weight ("wt %") and all ratios are molar ratios, unless otherwise noted. All numerical ranges are inclusive and combinable in any order, except where it is clear that such numerical ranges are constrained to add up to 100%.

The term "oligomer" refers to dimers, trimers, tetramers and other relatively low molecular weight materials that are capable of further curing. The term "polymer" includes the term "oligomer." By the term "curing" is meant any process that polymerizes or otherwise increases, such as by condensation, the molecular weight of a film or layer. The terms "film" and "layer" are used interchangeably. The articles "a", "an" and "the" refer to the singular and the plural. "Alkyl" and "alkylene" refer to linear, branched and cyclic alkyl and alkylene, respectively. "Alkylidene" refers to linear, branched and cyclic alkylidene. The term "(meth)acrylate" refers to both acrylate and methacrylate.

As used herein, "oxymetal layer" refers to any layer comprising $(-M-O-)_n$ domains, where M is a metal and n is an integer >1, and includes both oxymetal layers having a majority of $(-M-O-)_n$ domains and mixed domain layers having both metal nitride domains and $(-M-O-)_n$ domains. Oxymetal layers may optionally include one or more other elements such as carbon, which are preferably present in a relatively minor amount as compared to the $(-M-O-)_n$ domains.

"Domain", as used herein, means a compact crystalline, semi-crystalline, or amorphous region formed by corresponding blocks of certain linkages, such as (-M-O—)$_n$, linkages.

Compositions of the present invention comprise an organometallic compound of the formula

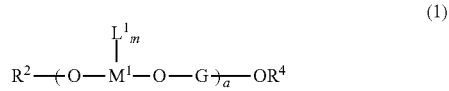
(1)

wherein $R^2=(C_1-C_{20})$hydrocarbyl; $M^1$ is a Group 3 to Group 14 metal; $G=R^3{}_b$-Ch-$R^3{}_b$ or Ch(OM$^1$L$^1{}_m$OR$^2$)$_c$; Ch=a chromophore moiety; $R^3$ is a divalent linking group having from 1 to 12 carbon atoms; $R^4$=H, $R^2$ or M(L$^1$)$_m$OR$^2$; $L^1$ is a ligand; m refers to the number of ligands and is an integer from 1-4; a=an integer from 1 to 20; each b is independently an integer from 0 to 25; c=1 or 2; and an organic solvent. It is preferred that a=an integer from 1 to 15, and more preferably from 1 to 10. When a>1, it will be appreciated by those skilled in the art that the organometallic compound is oligomeric. Preferably, c=1. $M^1$ is preferably chosen from Groups 4, 5, 6, 13, or 14. Preferred metals for $M^1$ are titanium, zirconium, hafnium, tungsten, tantalum, molybdenum, vanadium, indium, germanium, gallium, thallium, or aluminum.

Any ligand may suitably be used as $L^1$ in formula (I), such as neutral ligands and anionic ligands. Neutral ligands are formed from moieties that does not bear any charge, such as $CO_2$, and anionic ligands are formed from moieties that bear a negative charge, such as alkyl anions, as found in alkyl lithium compounds, for example $CH_3CH_2^-Li^+$. Preferably, $L^1$ is chosen from $(C_1-C_{20})$alkoxy, $(C_2-C_{20})$carboxyl, beta-diketonates, beta-hydroxyketonates, beta-ketoesters, beta-diketiminates, amindinates, guanidinates, or beta-hydroxyiminates, more preferably $(C_1-C_{12})$alkoxy, $(C_2-C_{12})$carboxyl, beta-diketonates, beta-hydroxyketonates, beta-ketoesters, beta-diketiminates, amindinates, guanidinates, or beta-hydroxyiminates, and even more preferably $(C_1-C_6)$alkoxy, $(C_2-C_6)$carboxyl, beta-diketonates, beta-hydroxyketonates, beta-ketoesters, beta-diketiminates, amindinates, guanidinates, or beta-hydroxyiminates. In one embodiment, the moiety selected for $L^1$ may have a surface energy of 20 to 40 erg/cm$^2$. The number of ligands is referred to in formula (I) by "m," which may be from 1-4, and preferably is from 2-4. Preferred ligands for $L^1$ include: ethoxy, n-propoxy, iso-propoxy, n-butoxy, iso-butoxy, n-pentoxy, benzoylacetonate; pentane-2,4-dionate (acetoacetate); hexafluoroacetoacetate; 2,2,6,6-tetramethylheptane-3,5-dionate; and ethyl-3-oxobutanoate (ethylacetoacetate).

$R^2$ in formula (I) may optionally comprise a heteroatom, such as an oxygen atom. Exemplary groups for $R^2$ include $(C_1-C_{20})$alkyl, $(C_1-C_{20})$alkylidene, $(C_6-C_{20})$aryl, $(C_7-C_{20})$alkaryl, or $(C_7-C_{20})$aralkyl. Preferably, $R^2$ is chosen from $(C_1-C_{12})$alkyl, $(C_1-C_{12})$alkylidene, $(C_6-C_{20})$aryl, $(C_7-C_{20})$alkaryl, or $(C_7-C_{20})$aralkyl.

$R^3$ in formula (I) may be any divalent linking group having from 1 to 12 carbon atoms, and may comprise one or more heteroatoms selected from the group consisting of oxygen, nitrogen, and sulfur. Preferably, $R^3$ is a divalent linking group having from 1 to 10 carbon atoms. It is preferred that $R^3$ is $(C_1-C_{12})$alkylene, $(C_1-C_{12})$alkylene-X— or $(C_1-C_{12})$alkylidene-X—, where X is independently chosen from O and S, more preferably $R^3$ is $(C_1-C_{12})$alkylene, $(C_1-C_{12})$alkylene-O— or $(C_1-C_{12})$alkylidene-O—, yet more preferably $(C_1-C_{10})$alkylene, $(C_1-C_{10})$alkylene-O— or $(C_1-C_{10})$alkylidene-O—, and even more preferably $(C_1-C_6)$alkylene, $(C_1-C_6)$alkylene-O— or $(C_1-C_6)$alkylidene-O—. Exemplary divalent linking groups for $R^3$ include: —(CH$_2$)$_z$—, where z=1-4; —(CH$_2$)$_p$—O— where p=2-6; —[(C$_2$H$_4$)—O]$_y$— where y=1-6; and —[(CH$_2$C(CH$_3$)H)—O]$_f$— where f=1-6. It is preferred that each b is an integer from 0 to 20, more preferably from 0 to 15, yet more preferably from 1 to 15, and even more preferably from 1 to 5. It is further preferred that one b≠0, and more preferably each b≠0. G is preferably chosen from Ch, Ch-$R^3{}_b$, $R^a{}_b$-Ch, $R^3{}_b$-Ch-$R^3{}_b$ or Ch(OM$^1$L$^1{}_m$OR$^2$)$_c$. It is preferred that the chromophore moiety, Ch, comprises one or more moieties chosen from an aromatic ring or an isocyanurate, and preferably an isocyanurate. Preferred aromatic ring chromophore moieties are phenyl, naphthyl, anthracenyl, and phenanthryl. The chromophore moiety may optionally be substituted by replacing one or more hydrogen atoms on the chromophore with one or more substituents chosen from $(C_1-C_6)$alkyl, cyano, halo, nitro and $SO_3$—Y, where Y=H, ammonium or an alkali metal ion. The particular chromophore moiety selected will depend on the particular n and k values desired. Such selection of the chromophore moiety is within the ability of one skilled in the art.

The present organometallic compounds may be prepared by a variety of methods known in the art, such as such as by the following general equation:

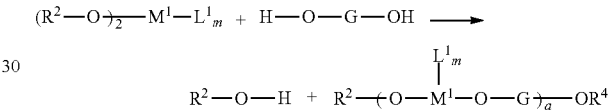

where $R^2$, $R^4$, $M^1$, $L^1$ and G are as defined above for formula (I). The compounds of formula (I) may contain a single metal species or a combination of different metal species, each of which has similar plasma etch resistance, but preferably contain a single metal species. Typically, such reaction is performed at a temperature of ≤200° C., and preferably ≤150° C.

A wide variety of organic solvents may suitably be used, provided that the organometallic compounds are soluble in the solvent or mixture of solvents selected. Such solvents include, but are not limited to, aromatic hydrocarbons, alcohols, lactones, esters, glycols, and glycol ethers. Mixtures of organic solvents may be used. Exemplary organic solvents include, without limitation, toluene, xylene, mesitylene, 2-methyl-1-butanol, 4-methyl-2-pentanol, methyl isobutyl carbinol, gamma-butyrolactone, ethyl lactate, methyl 2-hydroxyisobutyrate (HBM), propylene glycol methyl ether acetate, and propylene glycol methyl ether. Preferably, the organic solvents contain <10,000 ppm of water, more preferably <5000 ppm water, and even more preferably ≤500 ppm water. It is preferred that the organic solvents do not have free carboxylic acid groups or sulfonic acid groups.

The present organometallic compound compositions may optionally include one or more surface leveling agents (or surfactants). While any suitable surfactant may be used, such surfactants are typically non-ionic. The amount of such surfactants useful in the present compositions is well-known to those skilled in the art, and typically is in the range of 0 to 5% by weight, based on the total weight of the composition.

Optionally, the present organometallic compound compositions may further comprise one or more curing agents to aid in the curing of the deposited organometallic oligomer film. Exemplary curing agents include thermal acid generators and photoacid generators. Preferred curing agents are thermal acid generators. Such curing agents and their use are well-known to those skilled in the art, and are generally commercially available from a variety of sources. It is preferred that the present compositions are free of such curing agents.

The compositions of the present invention may optionally comprise a binder polymer that is free of metal, that is the binder polymer is not an organometallic polymer. The term "binder polymer" refers to a polymer that functions to bind the organometallic compound to a substrate. Surfactants are not "binder polymers" as that term is used herein. Preferred binder polymers are those having free hydroxyl moieties, such as those disclosed in U.S. patent application Ser. No. 13/776,496. Exemplary binder polymers are those comprising, as polymerized units, one or more of: hydroxy-substituted vinyl aromatic compounds such as hydroxystyrene; and hydroxy($C_2$-$C_{10}$)alkyl(meth)acrylates such as hydroxyethyl acrylate, hydroxyethyl methacrylate, hydroxypropyl acrylate, hydroxypropyl methacrylate, 2,3-dihydroxypropyl acrylate, 2,3-dihydroxypropyl methacrylate, 1-methyl-2-hydroxyethyl acrylate, 1-methyl-2-hydroxyethyl acrylate, 2-hydroxybutyl acrylate and 2-hydroxybutyl methacrylate. In one embodiment, the present compositions are free of a binder polymer.

The present organometallic compositions may optionally comprise a surface treating agent having a surface energy of 20 to 40 erg/cm$^2$ and comprising a surface treating moiety chosen from hydroxyl, protected hydroxyl, protected carboxyl, and mixtures thereof. The surface treating agent may be polymeric or non-polymeric, and is preferably polymeric. Polymeric surface treating agents may be linear or branched and comprise one or more of: pendant groups comprising one or more surface treating moieties, terminal groups comprising one or more surface treating moieties, and a polymer backbone comprising one or more surface treating moieties. While not wishing to be bound by theory, it is believed that the surface treating agent migrates toward the surface of the forming film during deposition of the present compositions and/or during any subsequent solvent removal step. It is believed that the relatively low surface energy of the surface treating agent helps drive the surface treating agent to the air interface. It will be appreciated by those skilled in the art that such migration of the surface treating agent should substantially occur before the complete curing of the oxymetal film. The formation of a cured oxymetal film substantially prohibits migration of the surface treating agent. Suitable surface treating agents are those disclosed in U.S. patent application Ser. No. 13/745,753.

Blends comprising organometallic compounds having a chromophore moiety of the invention with one or more organometallic compounds that do not have a chromophore moiety may be used in the present compositions. Also, mixtures of organometallic compounds having a chromophore moiety may be used in the present compositions. Compositions comprising the present organometallic compounds having a chromophore moiety are typically prepared by combining one or more organometallic compounds with one or more organic solvents, and any optional components. Mixtures of organometallic compounds may be used in the present compositions. It will be appreciated by those skilled in the art that the concentration of the organometallic compounds in the solvent may be varied across a wide range and that the thickness of any film deposited by a spin-on technique depends on the concentration of the oligomers in the solvent.

It has been found that organometallic compound compositions of the present invention can be used to deposit a film on a surface of an electronic device substrate. The organometallic compound film is then sufficiently cured such that the film does not intermix with a subsequently applied organic layer, such as an additional bottom antireflective coating (BARC) layer or a photoresist layer, while still maintaining sufficient chromophore moieties to provide a desired n and k value. Such cured films are suitable antireflective oxymetal layers, which may also function as hardmask layers.

The present compositions may be disposed on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15-90 seconds to obtain a desired layer of the organometallic oligomer of the substrate. It will be appreciated by those skilled in the art that the height of the organometallic oligomer layer may be adjusted by changing the spin speed.

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated.

After being deposited on the substrate, the organometallic compound layer is optionally baked at a relatively low temperature to remove any solvent and other relatively volatile components from the organometallic compound layer. Typically, the substrate is baked at a temperature of ≤125° C., preferably from 60 to 125° C., and more preferably from 90 to 115° C. The baking time is typically from 10 seconds to 10 minutes, preferably from 30 seconds to 5 minutes, and more preferably from 6 to 180 seconds. When the substrate is a wafer, such baking step may be performed by heating the wafer on a hot plate.

Following the baking step, the organometallic compound layer is cured in an oxygen-containing atmosphere, such as air, under conditions sufficient to provide an organic chromophore-containing antireflective oxymetal film. Such conditions are sufficient to cure the film such that it does not intermix with a subsequently applied organic layer, such as an additional antireflective layer or a photoresist layer, while still maintaining sufficient chromophore moieties in the film to provide desired n and k values. This curing step is conducted preferably on a hot plate-style apparatus, though oven curing may be used to obtain equivalent results. Typically, such curing is performed by heating the organometallic oligomer at a curing temperature of ≥150° C., and preferably 150 to 400° C. It is more preferred that the curing temperature is ≥200° C., still more preferably ≥250° C., and even more preferably from 250 to 350° C. It will be appreciated by those skilled in the art that at higher temperatures some of the organic moieties in the organometallic compound will be removed. The n and k values of the resulting oxymetal layer can be tailored by selecting an appropriate cure temperature such that a desired amount of the chromophore moiety remains in the resulting oxymetal film. When the present organometallic compound layers are cured at temperatures ≥200° C., the resulting metal oxymetal films are resistant to stripping (being removed) by solvents conventionally used in the application of antireflective coatings and photoresists. If the present organometallic compound films are cured at too high a temperature at this stage, such as >400° C., the organic chromophore moiety may be substantially or entirely removed from the resulting oxymetal film, thereby reducing the value of these films as BARCs, and the resulting film will also be resistant to stripping by alkaline or solvent developers conventionally used in the development of imaged photoresist layers. The curing time may be from 10 seconds to 10 minutes, preferably from 30 seconds to 5 minutes, more preferably from 45 seconds to 5 minutes, and yet more preferably from 45 to 180 seconds. The choice of final curing temperature depends mainly upon the desired curing rate, with higher curing temperatures requiring shorter curing times. This curing step is performed in order to thermally decompose a sufficient amount of the organometallic compound so that an oxymetal film is obtained that does not intermix with a subsequently applied organic layer, such as a photoresist or additional BARC layer, while providing desired n and k values.

The initial baking step may not be necessary if the curing step is conducted in such a way that rapid evolution of the solvents and curing by-products is not allowed to disrupt the film quality. For example, a ramped bake beginning at relatively low temperatures and then gradually increasing to the range of 250 to 400° C. can give acceptable results. It can be preferable in some cases to have a two-stage curing process, with the first stage being a lower bake temperature of less than 250° C., and the second stage being a higher bake temperature preferably between 250 and 350° C. Two stage curing processes facilitate uniform filling and planarization of pre-existing substrate surface topography, for example filling of trenches and vias.

The present organometallic compounds may be cured in air or in an inert atmosphere, such as nitrogen. While not wishing to be bound by theory, it is believed that the conversion of the organometallic compound to metal oxide may be facilitated by moisture that is contained in the coating and/or adsorbed from the atmosphere during the deposition (casting) and curing processes.

The organic chromophore-containing antireflective oxymetal films may suitably be used as BARCs. For example, a photoresist may be disposed, such as by spin coating, on the surface of the cured oxymetal film. A wide variety of photoresists may be suitably used, such as those used in 193 nm lithography, such as those sold under the EPIC™ brand available from Dow Electronic Materials. Suitable photoresists may be either positive tone development or negative tone development resists. Following coating on the organic chromophore-containing antireflective oxymetal layer, the photoresist layer is then imaged (exposed) using patterned actinic radiation, and the exposed photoresist layer is then developed using the appropriate developer to provide a patterned photoresist layer. The pattern is next transferred from the photoresist layer to the underlying organic chromophore-containing antireflective oxymetal layer and substrate by appropriate etching techniques known in the art, such as by plasma etching. Following etching, the photoresist layer and the oxymetal layer are removed using conventional techniques. The electronic device substrate is then processed according to conventional means.

The chromophore moiety, Ch, in formula (I) is selected so as to provide the desired n and k values in the resulting chromophore-containing oxymetal antireflective film. Optionally, an organic BARC layer may be disposed, such as by any suitable method described above, on the surface of the organic chromophore-containing oxymetal film and then a photoresist may be disposed on the BARC layer, and processed as described above. Exemplary BARCs include those available under the ARC brand from Brewer Science and those available under the AR™ brand, such as AR™137 antireflectant, available from Dow Electronic Materials (Marlborough, Mass.).

The surface energy of a cured oxymetal layer, where essentially all (that is, at least 95% by weight) of the organometallic compound has been decomposed so that extremely high metal oxide-content films are formed is typically relatively high, typically having a water contact angle ≤50°, such as from 35 to 45°. As surface energy is often difficult to measure, surrogate measurements, such as water contact angles, are typically used. The determination of water contact angles is well-known, and a preferred method uses using a Kruss drop shape analyzer Model 100, using deionized ("DI") water and a 2.5 μL drop size. Due to their organic content, the present organic chromophore-containing oxymetal films typically have a static water contact angle of ≥55°, such as from 55 to 70°. Such a water contact angle is similar to that of subsequently applied organic layers, such as a photoresist, which typically have a static water contact angle of 60 to 70°. That is, the surface energy of the present organic chromophore-containing oxymetal films is compatible with that of a subsequently applied organic layer, such as a photoresist. In the event that the surface energy of the present organic chromophore-containing oxymetal films is too high, the surface of such films may be treated with an appropriate surface treating agent to lower the surface energy (raise the water contact angle) so as to make the surface more compatible with a subsequently applied organic layer. Such a treatment is described in U.S. patent application Ser. No. 13/745,752. Following such treatment, the organic chromophore-containing antireflective oxymetal film surface has a surface energy that substantially matches that of a subsequently applied organic layer, that is, the surface energy of the treated oxymetal layer should be within 20% of the surface energy of a subsequently applied organic layer, and preferably within 10%.

EXAMPLE 1

An organometallic oligomer comprising a chromophore moiety was prepared as follows. To a flask equipped with a Dean-Stark trap were added $Ti(OR)_2(acac)_2$ (R=n-butyl or isoporopyl, Tyzor AA-105, available from DuPont) and 0.33 equivalents of tris-(2-hydroxyethyl)isocyanurate (TCEIC). This mixture was heated at 120-130° C., stirred for 1-2 days and the distillate collected. The mixture was then cooled and quenched in heptane (500 mL). The precipitated solid was dried in vacuum to give 13 g of desired product, Polymer A, shown in Equation 1, below.

Equation 1

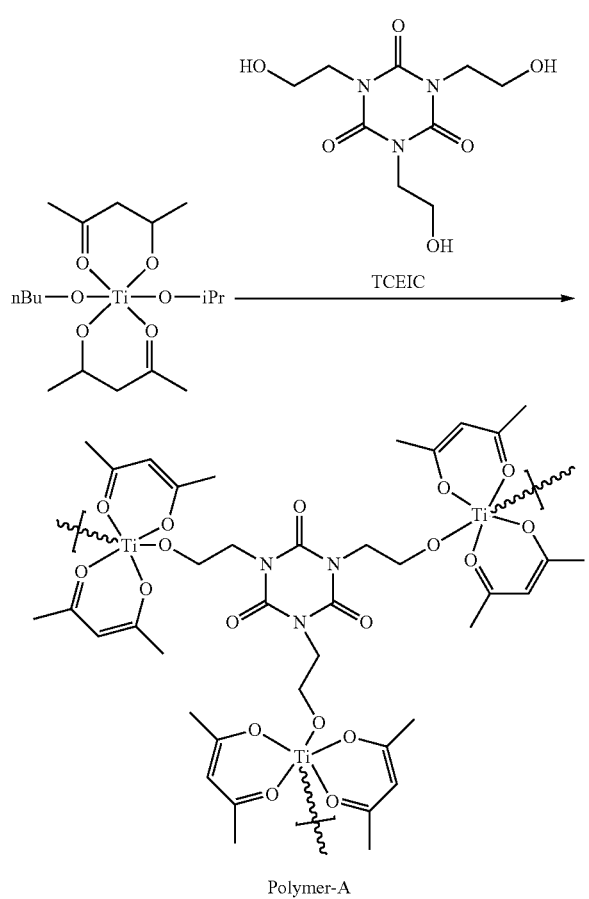

Polymer-A

EXAMPLE 2

The procedure of Example 1 is repeated except that zirconium bis(acetylacetone)-bis(n-butoxide) (or Zr(acac)$_2$(OBu)$_2$) is reacted with 0.33 equivalents of TCEIC, to provide Polymer B.

EXAMPLE 3

The procedure of Example 1 is repeated except that hafnium bis(acetylacetone)-bis(n-butoxide) (or Hf(acac)$_2$(OBu)$_2$) is reacted with 0.33 equivalents of TCEIC to provide Polymer C.

COMPARATIVE EXAMPLE 4

The procedure of Example 1 was repeated except that TTCEIC was replaced with approximately 1 equivalent of diethylene glycol, to provide the Comparative Polymer 1, as shown in Equation 2.

Equation 2

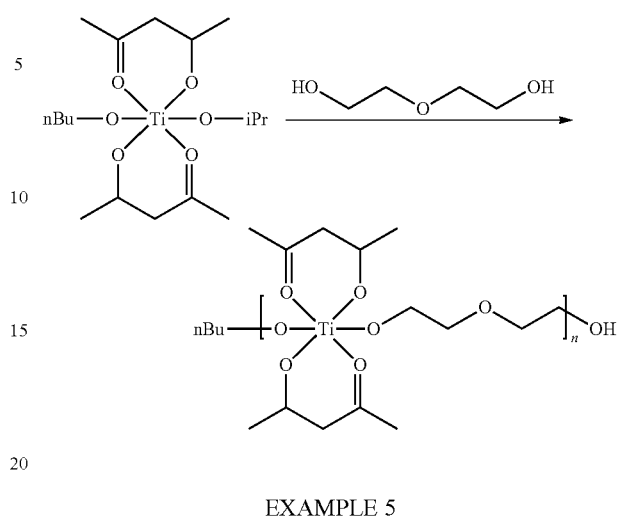

EXAMPLE 5

Polymer A and Comparative Polymer were individually formulated in a mixture of 2-methyl-1-butanol and gamma-butyrrolactone (95/5 weight ratio) at 3.5 wt % solids and filtered through 0.2 μm poly(tetrafluoroethylene) (PTFE) syringe filter. The obtained solutions were coated on a silicon wafer having a layer of AR™26 Antireflectant (available from Dow Electronic Materials) at 1500 rpm and baked at 280° C. for 60 seconds. Next, a layer of a commercial photoresist (either 193 nm or 248 nm resist, available from Dow Electronic Materials) was spin coated on the surface of both Polymer A and Comparative Polymer. The n/k values of the obtained polymer films were measured using VUV-VASE (J.A. Woolam Co. Inc.), and substrate reflectivity was calculated using Prolith™ software from KLA-Tencor Co. under the condition indicated in Table 1.

TABLE 1

| Film stack | Resist | FT = 95 nm |
| --- | --- | --- |
|  | Polymer to be evaluated | FT = 0~100 nm, n/k varied |
|  | AR ™ 26 bottom layer | FT = 80 nm, n(193) = 1.695, k(193) = 0.628 |
|  | Si |  |
| Illumination | ArF immersion exposure at 1.35 NA, dipole-35Y, o/i = 0.98/0.86, X-polarization 39 nm 1:1 L/S, binary mask | |

Table 2 summarizes the n/k values and minimum reflectivity. By incorporating TCEIC, n-value was increased from 1.69 to 1.85, and the minimum reflectivity was reduced from 3.3% to 2.1%.

TABLE 2

|  | 193 nm Photoresist | | | 248 nm Photoresist | |
| --- | --- | --- | --- | --- | --- |
|  | n | k | R % (FT) | n | k |
| Polymer A | 1.846 | 0.536 | 4.6% (19 nm) | 1.849 | 0.271 |
| Comparative Polymer | 1.695 | 0.502 | 5.0% (36 nm) | 1.913 | 0.606 |

EXAMPLE 6

A 5 L three-necked flask was equipped with a reflux condenser, a mechanical stirrer and an inlet adapter. To this reactor was added 400 g of Hf(OBu)$_4$ (0.85 mol) and 2.3 L of anhydrous tetrahydrofuran (THF), and this mixture was stirred vigorously using a mechanical stirrer. To this stirred mixture was added a solution of 700 mL of anhydrous THF and pentane-2,4-dione (170 g, 1.7 mol) over 6 hours via a Scilog pump. The reaction mixture was stirred overnight at room temperature. The reaction mixture was then reduced to dryness under vacuum. 800 mL of anhydrous ethyl acetate was added and the mixture was stirred vigorously at room temperature for several hours. This solution was filtered through a fine frit to remove any insoluble material. The solvent was removed from the filtrate under vacuum and a pale white solid (Hf(acac)$_2$(OBu)$_2$) was obtained (288.5 g, 65% yield), which was used without further purification.

COMPARATIVE EXAMPLE 7

A 2 L three-necked flask was equipped with a reflux condenser, a mechanical stirrer and a thermocouple. To this flask was added anhydrous ethyl acetate (1.3 L) solution of Hf(acac)$_2$(OBu)$_2$ from Example 6 (288.5 g, 0.55 mol), and ethylene diglycol (55.5 g, 0.52 mol), and the reaction mixture was refluxed at 80° C. for 16-18 hours. Next, the solution was cooled to 25° C. and then filtered through a fine frit to remove any precipitated solid (94 g). The filtrate was reduced in volume and then quenched into 10× volume of heptane with stirring overnight. The solid was collected and washed with heptane three times (3×1 L). The white powder was dried under strong vacuum for 2 hours, yielding 135 g of a white polymer, Comparative Polymer 2, as shown in Equation 3.

Equation 3

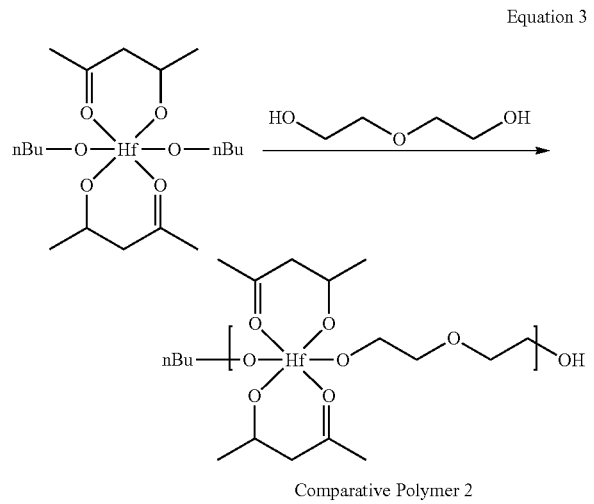

Comparative Polymer 2

EXAMPLE 8

To a 500 mL three-necked flask was equipped with a mechanical stirrer, condenser, inlet stopper, and a gas inlet was added 50 g of Hf(OBu)$_4$ (0.106 moles) and 150 mL of anhydrous THF under a blanket of N$_2$. A solution of pentane-2,4-dione (2 equivalents) and 50 mL of anhydrous THF was added via a Scilog pump over 6 hours, and the reaction mixture stirred over night. The THF was removed under reduced pressure and the resulting white solid was triturated with 400 mL of anhydrous ethyl acetate for 2-3 hours to dissolve all solids. The reaction mixture was then transferred to a 500 mL three-necked flask and 1,4-dimethanol benzene was added.

The reaction mixture was heated to reflux while removing 100 mL ethyl acetate, and held at reflux for 18 hours. The reaction mixture was then cooled to room temperature and then concentrated to 100-150 mL and then quenched into 10× volume of heptanes yielding a free flowing solid which coagulated into a gummy solid. This was allowed to stand in heptanes while the gummy material was manipulated. The gummy material eventually became free flowing and was left stirring overnight. The solids were collected, washed with heptanes, and then vacuum dried at 40° C. overnight to yield 41 g of product, Polymer D, as shown in Equation 4.

Equation 4

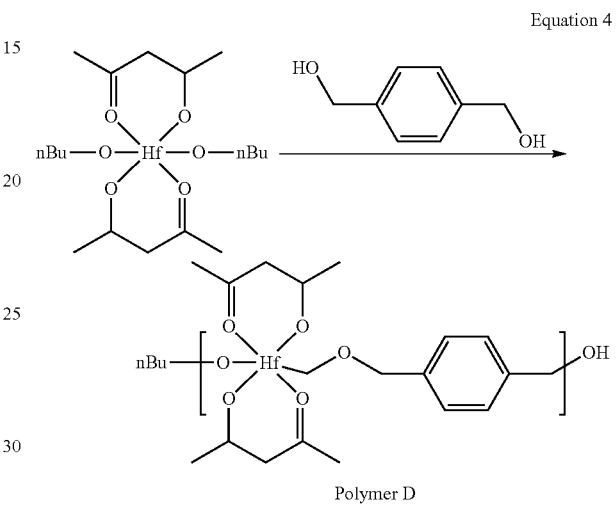

Polymer D

EXAMPLE 9

The procedure of Example 5 was repeated except that Polymer D,
Comparative Polymer 2, and a 1:1 blend of Polymer D and Comparative Polymer 2 were used. The data are shown in Table 3, which clearly shows that Polymer D itself, and in combination with Comparative Polymer 2, provides reduced reflectivity.

TABLE 3

| | 193 nm | | | 248 nm | |
|---|---|---|---|---|---|
| | n | k | R % (FT) | n | k |
| Comparative Polymer 2 | 1.912 | 0.074 | 1.46% (17 nm) | 1.689 | 0.014 |
| Polymer D | 1.819 | 0.469 | 3.41% (24 nm) | 1.795 | 0.127 |
| Blend of Comparative Polymer 2 and Polymer D | 1.862 | 0.298 | 0.48% (24 nm) | 1.771 | 0.089 |

What is claimed is:
1. A composition comprising: an organometallic compound of the formula

(1)

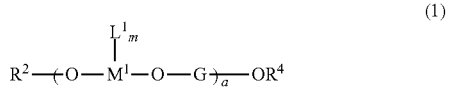

wherein $R^2=(C_1-C_{20})$hydrocarbyl; $M^1$ is a Group 3 to Group 14 metal; $G=R^3{}_b\text{-Ch-}R^3{}_b$ or $Ch(OM^1L^1{}_mOR^2)_c$; Ch=a chromophore moiety; $R^3$ is a divalent linking group having from 1 to 12 carbon atoms; $R^4=H$, $R^2$ or $M(L^1)_mOR^2$; $L^1$ is a ligand; m refers to the number of ligands and is an integer from 1-4; a=an integer from 1 to 20; each b is independently an integer from 0 to 25; c=1 or 2; an organic solvent; and a surface treating polymer having a surface energy of 20 to 40 erg/cm² and comprising a surface treating moiety chosen from hydroxyl, protected hydroxyl, protected carboxyl, or mixtures thereof.

2. The composition of claim 1 wherein $M^1$ is chosen from titanium, zirconium, hafnium, tungsten, tantalum, molybdenum, vanadium, indium, germanium, gallium, thallium, and aluminum.

3. The composition of claim 1 wherein each $L^1$ is chosen from $(C_1-C_{20})$alkoxy, $(C_2-C_{20})$carboxyl, beta-diketonates, beta-hydroxyketones, beta-ketoesters, beta-diketiminates, amindinates, guanidinates, or beta-hydroxyiminates.

4. The composition of claim 1 wherein the chromophore moiety comprises one or more of an aromatic ring or an isocyanurate.

5. The composition of claim 4 wherein the aromatic ring is chosen from phenyl, naphthyl, anthracenyl, or phenanthryl.

6. The composition of claim 1 wherein $R^3$ comprises one or more atoms selected from the group consisting of oxygen, nitrogen, and sulfur.

7. The composition of claim 1 wherein $R^3$ is selected from the group consisting of $(C_2-C_{12})$alkylene-O— and $(C_2-C_{12})$alkylidene-O—.

8. The composition of claim 1 wherein G is chosen from Ch, Ch-$R^3{}_b$, $R^a{}_b$-Ch, or $Ch(OM^1L^1{}_mOR^2)_c$.

9. The composition of claim 1 wherein the chromophore moiety is substituted with one or more substituents selected from the group consisting of $(C_1-C_6)$alkyl, cyano, halo, nitro and $SO_3$—Y, where Y=H, ammonium or an alkali metal ion.

10. A composition comprising: an organometallic compound of the formula

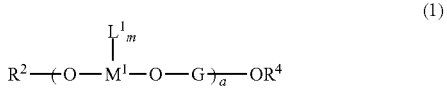

wherein $R^2=(C_1-C_{20})$hydrocarbyl; $M^1$ is a Group 3 to Group 14 metal; $G=R^3{}_b\text{-Ch-}R^3{}_b$ or $Ch(OM^1L^1{}_mOR^2)_c$; Ch=a chromophore moiety; $R^3$ is a divalent linking group having from 1 to 12 carbon atoms; $R^4=H$, $R^2$ or $M(L^1)_mOR^2$; $L^1$ is a ligand; m refers to the number of ligands and is an integer from 1-4; a=an integer from 1 to 20; each b is independently an integer from 0 to 25; c=1 or 2; and an organic solvent; wherein the chromophore moiety is an isocyanurate.

11. The composition of claim 10 wherein $M^1$ is chosen from titanium, zirconium, hafnium, tungsten, tantalum, molybdenum, vanadium, indium, germanium, gallium, thallium, and aluminum.

12. The composition of claim 10 wherein each $L^1$ is chosen from $(C_1-C_{20})$alkoxy, $(C_2-C_{20})$carboxyl, beta-diketonates, beta-hydroxyketones, beta-ketoesters, beta-diketiminates, amindinates, guanidinates, or beta-hydroxyiminates.

13. The composition of claim 10 further comprising a surface treating polymer having a surface energy of 20 to 40 erg/cm² and comprising a surface treating moiety chosen from hydroxyl, protected hydroxyl, protected carboxyl, or mixtures thereof.

14. The composition of claim 10 wherein $R^3$ comprises one or more atoms selected from the group consisting of oxygen, nitrogen, and sulfur.

15. The composition of claim 10 wherein G is chosen from Ch, Ch-$R^3{}_b$, $R^3{}_b$-Ch, or $Ch(OM^1L^1{}_mOR^2)_c$.

16. The composition of claim 10 wherein the chromophore moiety is substituted with one or more substituents selected from the group consisting of $(C_1-C_6)$alkyl, cyano, halo, nitro and $SO_3$—Y, where Y=H, ammonium or an alkali metal ion.

* * * * *